(12) United States Patent
Groe et al.

(10) Patent No.: US 7,679,468 B1
(45) Date of Patent: Mar. 16, 2010

(54) $K_{FM}$ FREQUENCY TRACKING SYSTEM USING A DIGITAL CORRELATOR

(75) Inventors: John B. Groe, Poway, CA (US); Kenneth Scott Walley, Carlsbad, CA (US)

(73) Assignee: QUINTIC Holdings, Santa Clara, CA (US)

( * ) Notice: Subject to any disclaimer, the term of this patent is extended or adjusted under 35 U.S.C. 154(b) by 60 days.

(21) Appl. No.: 11/829,817

(22) Filed: Jul. 27, 2007

Related U.S. Application Data

(60) Provisional application No. 60/834,198, filed on Jul. 28, 2006.

(51) Int. Cl.
*H03C 3/06* (2006.01)
(52) U.S. Cl. .......................... 332/128; 332/127; 331/23
(58) Field of Classification Search ................ 332/127, 332/128; 331/23
See application file for complete search history.

(56) References Cited

U.S. PATENT DOCUMENTS

| 448,539 | A | | 3/1891 | Morris |
|---|---|---|---|---|
| 599,071 | A | | 2/1898 | Barr |
| 4,263,560 | A | | 4/1981 | Ricker |
| 4,430,627 | A | | 2/1984 | Machida |
| 4,546,331 | A | * | 10/1985 | DaSilva et al. .............. 332/128 |
| 4,769,588 | A | | 9/1988 | Panther |
| 4,816,772 | A | | 3/1989 | Klotz |
| 4,926,135 | A | | 5/1990 | Voorman |
| 4,965,531 | A | | 10/1990 | Riley |
| 4,994,768 | A | | 2/1991 | Shepherd et al. |
| 5,006,818 | A | | 4/1991 | Koyama et al. |
| 5,015,968 | A | | 5/1991 | Podell et al. |
| 5,030,923 | A | | 7/1991 | Arai |
| 5,150,082 | A | * | 9/1992 | Grimmett et al. ........... 332/128 |
| 5,289,136 | A | | 2/1994 | DeVeirman et al. |
| 5,331,292 | A | | 7/1994 | Worden et al. |
| 5,399,990 | A | | 3/1995 | Miyake |
| 5,491,450 | A | | 2/1996 | Helms et al. |
| 5,508,660 | A | | 4/1996 | Gersbach et al. |
| 5,548,594 | A | | 8/1996 | Nakamura |
| 5,561,385 | A | | 10/1996 | Choi |
| 5,581,216 | A | | 12/1996 | Ruetz |
| 5,631,587 | A | | 5/1997 | Co et al. |
| 5,648,744 | A | | 7/1997 | Prakash et al. |
| 5,677,646 | A | | 10/1997 | Entrikin |
| 5,739,730 | A | | 4/1998 | Rotzoll |
| 5,767,748 | A | | 6/1998 | Nakao |
| 5,818,303 | A | | 10/1998 | Oishi et al. |
| 5,834,987 | A | | 11/1998 | Dent |
| 5,862,465 | A | | 1/1999 | Ou |
| 5,878,101 | A | | 3/1999 | Aisaka |
| 5,880,631 | A | | 3/1999 | Sahota |
| 5,939,922 | A | | 8/1999 | Umeda |
| 5,945,855 | A | | 8/1999 | Momtaz |
| 5,949,286 | A | | 9/1999 | Jones |
| 5,990,740 | A | | 11/1999 | Groe |

(Continued)

*Primary Examiner*—Robert Pascal
*Assistant Examiner*—Levi Gannon
(74) *Attorney, Agent, or Firm*—Blairtech Solution LLC

(57) ABSTRACT

An apparatus for providing a two point phase/frequency modulation system is disclosed herein. The apparatus includes a first network configured to introduce an offset to center a signal applied to a VCO. The apparatus further includes a second network configured to set a gain of the VCO. A phase tracking network is configured to dynamically adjust the offset and the gain.

14 Claims, 14 Drawing Sheets

PM Tracking Network

U.S. PATENT DOCUMENTS

| | | | |
|---|---|---|---|
| 5,994,959 A | 11/1999 | Ainsworth | |
| 5,999,056 A | 12/1999 | Fong | |
| 6,011,437 A | 1/2000 | Sutardja et al. | |
| 6,018,651 A | 1/2000 | Bruckert et al. | |
| 6,044,124 A | 3/2000 | Monahan et al. | |
| 6,052,035 A | 4/2000 | Nolan et al. | |
| 6,057,739 A | 5/2000 | Crowley et al. | |
| 6,060,935 A | 5/2000 | Shulman | |
| 6,091,307 A | 7/2000 | Nelson | |
| 6,100,767 A | 8/2000 | Sumi | |
| 6,114,920 A | 9/2000 | Moon et al. | |
| 6,163,207 A | 12/2000 | Kattner et al. | |
| 6,173,011 B1 | 1/2001 | Rey et al. | |
| 6,191,956 B1 | 2/2001 | Foreman | |
| 6,204,728 B1 | 3/2001 | Hageraats | |
| 6,211,737 B1 | 4/2001 | Fong | |
| 6,229,374 B1 | 5/2001 | Tammone, Jr. | |
| 6,234,387 B1 | 5/2001 | Cuthbert et al. | |
| 6,246,289 B1 | 6/2001 | Pisati et al. | |
| 6,255,889 B1 | 7/2001 | Branson | |
| 6,259,321 B1 | 7/2001 | Song et al. | |
| 6,288,609 B1 | 9/2001 | Brueske et al. | |
| 6,298,093 B1 | 10/2001 | Genrich | |
| 6,333,675 B1 | 12/2001 | Saito | |
| 6,370,372 B1 | 4/2002 | Molnar et al. | |
| 6,392,487 B1 | 5/2002 | Alexanian | |
| 6,404,252 B1 | 6/2002 | Wilsch | |
| 6,476,660 B1 | 11/2002 | Visocchi et al. | |
| 6,515,553 B1 | 2/2003 | Filiol et al. | |
| 6,549,078 B1 | 4/2003 | Sridharan et al. | |
| 6,559,717 B1 | 5/2003 | Lynn et al. | |
| 6,560,448 B1 | 5/2003 | Baldwin et al. | |
| 6,571,083 B1 | 5/2003 | Powell, II et al. | |
| 6,577,190 B2 | 6/2003 | Kim | |
| 6,583,671 B2 | 6/2003 | Chatwin | |
| 6,583,675 B2 | 6/2003 | Gomez | |
| 6,639,474 B2 | 10/2003 | Asikainen et al. | |
| 6,664,865 B2 | 12/2003 | Groe et al. | |
| 6,683,509 B2 | 1/2004 | Albon et al. | |
| 6,693,977 B2 | 2/2004 | Katayama et al. | |
| 6,703,887 B2 | 3/2004 | Groe | |
| 6,711,391 B1 | 3/2004 | Walker et al. | |
| 6,724,235 B2 | 4/2004 | Costa et al. | |
| 6,734,736 B2 | 5/2004 | Gharpurey | |
| 6,744,319 B2 | 6/2004 | Kim | |
| 6,751,272 B1 | 6/2004 | Burns et al. | |
| 6,753,738 B1 | 6/2004 | Baird | |
| 6,763,228 B2 | 7/2004 | Prentice et al. | |
| 6,774,740 B1 * | 8/2004 | Groe | 332/103 |
| 6,777,999 B2 | 8/2004 | Kanou et al. | |
| 6,781,425 B2 | 8/2004 | Si | |
| 6,795,843 B1 | 9/2004 | Groe | |
| 6,798,290 B2 | 9/2004 | Groe et al. | |
| 6,801,089 B2 | 10/2004 | Costa et al. | |
| 6,845,139 B2 | 1/2005 | Gibbons | |
| 6,856,205 B1 | 2/2005 | Groe | |
| 6,870,411 B2 | 3/2005 | Shibahara et al. | |
| 6,917,791 B2 | 7/2005 | Chadwick | |
| 6,928,101 B2 * | 8/2005 | Feher | 375/130 |
| 6,940,356 B2 | 9/2005 | McDonald, II et al. | |
| 6,943,600 B2 | 9/2005 | Craninckx | |
| 6,975,687 B2 | 12/2005 | Jackson et al. | |
| 6,985,703 B2 | 1/2006 | Groe et al. | |
| 6,990,327 B2 | 1/2006 | Zheng et al. | |
| 7,062,248 B2 | 6/2006 | Kuiri | |
| 7,065,334 B1 | 6/2006 | Otaka et al. | |
| 7,088,979 B1 | 8/2006 | Shenoy et al. | |
| 7,123,102 B2 | 10/2006 | Uozumi et al. | |
| 7,142,062 B2 | 11/2006 | Vaananen et al. | |
| 7,148,764 B2 | 12/2006 | Kasahara et al. | |
| 7,171,170 B2 | 1/2007 | Groe et al. | |
| 7,215,215 B2 | 5/2007 | Hirano et al. | |
| 2002/0031191 A1 | 3/2002 | Shimizu | |
| 2002/0071497 A1 | 6/2002 | Bengtsson et al. | |
| 2002/0193009 A1 | 12/2002 | Reed | |
| 2003/0078016 A1 | 4/2003 | Groe et al. | |
| 2003/0092405 A1 | 5/2003 | Groe et al. | |
| 2003/0118143 A1 | 6/2003 | Bellaouar et al. | |
| 2003/0197564 A1 | 10/2003 | Humphreys et al. | |
| 2004/0017862 A1 | 1/2004 | Redman-White | |
| 2004/0051590 A1 | 3/2004 | Perrott et al. | |
| 2005/0093631 A1 | 5/2005 | Groe | |
| 2005/0099232 A1 | 5/2005 | Groe et al. | |

* cited by examiner

$K_{FM}$ FREQUENCY TRACKING SYSTEM USING A DIGITAL CORRELATOR

This application claims priority under 35 U.S.C. §119(e) to co-pending U.S. Provisional Patent Application Ser. No. 60/834,198, entitled $K_{FM}$ PHASE TRACKING SYSTEM USING A DIGITAL CORRELATOR, filed on Jul. 28, 2006, which is incorporated by reference herein for all purposes. This application is related to U.S. patent application Ser. No. 11/829,828, entitled $K_{FM}$ FREQUENCY TRACKING SYSTEM USING AN ANALOG CORRELATOR, filed on Jul. 27, 2007, now U.S. Pat. No. 7,522,005.

FIELD OF THE INVENTION

The present application relates generally to phase/frequency modulators, and more particularly, to a system for $K_{FM}$ phase tracking using a digital correlator.

BACKGROUND OF THE INVENTION

Phase modulation schemes are very effective and are therefore widely used in communication systems. A simple example of a phase modulation scheme is quaternary phase shift keying (QPSK). FIG. 1 shows a constellation diagram that illustrates how QPSK maps two-bit digital data to one of four phase offsets. FIG. 2 shows a typical QPSK (or I/Q) modulator used to generate a phase-modulated signal. This technique relies on orthogonal signal vectors to realize the phase offsets—an inherently linear technique, since it depends solely on the matching of these orthogonal signals.

The I/Q modulator provides a straightforward approach to generating phase-modulated signals. But, it is also possible to generate the phase-modulated signals using a phase-locked loop. This approach offers reduced circuitry, lowers power consumption, and as a result, finds widespread use in narrowband systems. A variation of this approach, known as two-point modulation, introduces direct modulation of a voltage-controlled oscillator (VCO) to support wideband phase modulation. Unfortunately, this requires the gain of the VCO to be accurately set—a difficult task since the VCO gain depends on multiple factors. It would therefore be advantageous to have a system to accurately set the gain of a VCO.

SUMMARY OF THE INVENTION

In one or more embodiments, a very efficient system for wideband phase modulation is provided. The system comprises hardware and/or software for accurately setting the offset and gain of a VCO used in a phase-locked loop, and then dynamically adjusting these parameters based on the output of a phase tracking loop.

In one aspect the present invention relates to an apparatus for providing a two point phase/frequency modulation system. The apparatus includes a first network configured to introduce an offset to center a signal applied to a VCO. The apparatus further includes a second network configured to set a gain of the VCO. A phase tracking network is configured to dynamically adjust the offset and the gain.

In another aspect the invention is directed to an apparatus for phase tracking in a two point phase/frequency modulation system and for adjusting an offset and scale of a signal applied to a VCO. The apparatus includes a subtracting integrator configured to capture a dynamic correction signal. The apparatus further includes a window comparator configured to determine a polarity of an output signal of the integrator. A correlator is configured to project the dynamic correction signal onto a reference modulation signal. The apparatus further includes logic including a first counter configured to scale the signal applied to the VCO based upon an output of the correlator and a second counter configured to offset the signal applied to the VCO based upon an output of the correlator.

In yet another aspect the present invention pertains to apparatus for tracking the operation of a two point phase/frequency modulation system so as to enable adjustment of an offset and/or scaling applied to a signal driving a VCO. The apparatus includes a subtracting integrator configured to capture a dynamic correction signal and an A/D converter for measuring an output of the integrator. A correlator is configured to project the dynamic correction signal onto a reference modulation signal and produce a correlation signal. The apparatus further includes logic comprising a first counter configured to scale the signal applied to the VCO in response to the correlation signal; and a second counter configured to offset the signal applied to the VCO in response to the correlation signal.

In a further aspect the present invention relates to a phase/frequency modulation system. The system includes a phase-locked loop (PLL) having a VCO including a first port and a second port wherein during operation of the PLL an error signal is received by the first port. A correlator network is configured to produce an output signal based upon the error signal and a function of an FM signal. The system further includes a phase tracking loop which generates, in response to the output signal, a VCO control signal applied to the second port.

BRIEF DESCRIPTION OF THE DRAWINGS

The foregoing aspects and the attendant advantages of the embodiments described herein will become more readily apparent by reference to the following description when taken in conjunction with the accompanying drawings wherein:

FIG. 6b illustrates the frequency response of the fractional-N PLL shown in FIG. 6a;

FIG. 7b illustrates the frequency response of the direct phase/frequency modulator shown in FIG. 7a;

FIG. 10a shows the equivalent series capacitance of the back-to-back MOSFET devices within the VCO detailed in FIG. 8a;

FIG. 10b shows the frequency modulation resulting from the control of the back-to-back MOSFET devices in the VCO of FIG. 8a;

FIG. 10c shows the VCO gain $K_{FM}$ sensitivity for the VCO in FIG. 8a;

FIG. 14b shows the subtracting integrator of FIG. 14a;

FIG. 14c shows the window comparator of FIG. 14a;

FIG. 14d illustrates the timing associated with the calibration system of FIG. 14a;

FIG. 14e illustrates the mask generator of FIG. 14a;

FIG. 14g illustrates the convergence of the calibration system of FIG. 14a;

DETAILED DESCRIPTION OF EMBODIMENTS OF THE INVENTION

Figure 1:
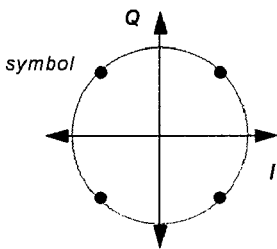
FIG. 1 shows a constellation diagram that illustrates how QPSK maps two-bit digital data to one of four offsets.
Figure 2:
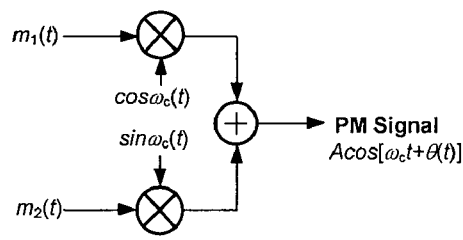
FIG. 2 shows a diagram of a typical I/Q modulator.
Figure 3:
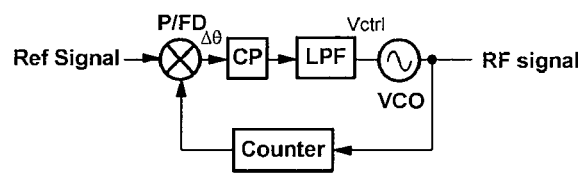
FIG. 3 shows a PLL that is used to synthesize a radio frequency carrier signal.
Figure 4:
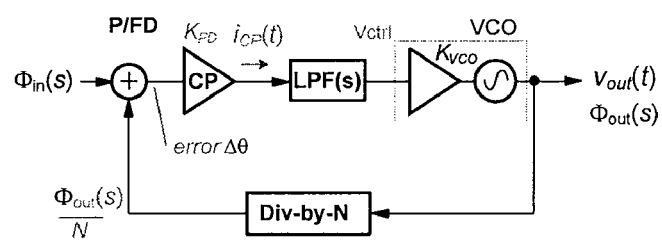
FIG. 4 shows a mathematical model of the PLL shown in FIG. 3.

A phase-locked loop (PLL) comprising a VCO, feedback counter (counter), phase/frequency detector (P/FD), charge pump (CP), and integration filter (LPF) is shown in FIG. 3. It is described by the mathematical model shown in FIG. 4.

The phase-locked loop uses feedback to minimize the phase difference between a very accurate reference signal and its output signal. As such, it produces an output signal at a frequency given by;

$$f_{VCO} = Nf_{REF}$$

where $f_{vco}$ is the frequency of the VCO output signal, N is the value of the feedback counter, and $f_{REF}$ is the frequency of the reference signal.

The VCO produces an output signal at a frequency set by the control voltage $v_{ctrl}$ according to;

$$v_{out}(t) = A\cos(\omega_o t + K_{vco}\int v_{ctrl}(t)dt)$$

where $\omega_o$ is the free-running frequency of the VCO and $K_{vco}$ is its associated gain. The gain $K_{vco}$ describes the relationship between the excess phase of the carrier $\Phi_{out}$ and the control voltage $v_{ctrl}$ with;

$$\frac{\Phi_{out}(s)}{v_{ctrl}(s)} = \frac{K_{vco}}{s}$$

where $K_{vco}$ is in radians/V. The VCO drives the feedback counter, which divides the output phase $\Phi_{out}$ by N. When the phase-locked loop is stable, the phase detector and charge pump circuits generate an output signal $i_{CP}$ that is proportional to the phase difference $\Delta\theta$ between the two signals applied to the phase detector. The output signal $i_{CP}$ can therefore be expressed as;

$$i_{CP}(s) = K_{pd}\frac{\Delta\theta(s)}{2\pi}$$

where $K_{pd}$ is in A/radians and $\Delta\theta$ is in radians.

Figure 5:
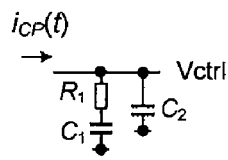
FIG. 5 shows an integration filter.

A simple integration filter, comprising resistor $R_1$ and capacitors $C_1$-$C_2$ as shown in FIG. 5, transforms the output signal $i_{CP}$ to the control voltage $v_{ctrl}$ as follows;

$$v_{ctrl}(s) = i_{CP}(s)Z(s) = i_{cp}(s)\left(\frac{sR_1C_1 + 1}{s^2R_1C_1C_2 + s(C_1+C_2)}\right)$$

where a zero (at $1/R_1C_1$) has been added to stabilize the second order system and the capacitor $C_2$ has been included to reduce any ripple on the control voltage. Combining the above relations yields the closed-loop response of the system to an input signal, which can be expressed as;

$$T_1(s) = \frac{NK_{PD}K_{VCO}Z(s)}{sN + K_{PD}K_{VCO}Z(s)}.$$

In a PLL, the feedback counter value N effectively sets the output frequency. In practice, its digital structure restricts N to integer numbers. As a result, the frequency resolution (or frequency step size) of an integer-N PLL is nominally set by $f_{REF}$. Fortunately, it is possible to dramatically decrease the effective frequency step by manipulating the value of N to yield a non-integer average value. This is the concept of a fractional-N PLL.

Figure 6A:
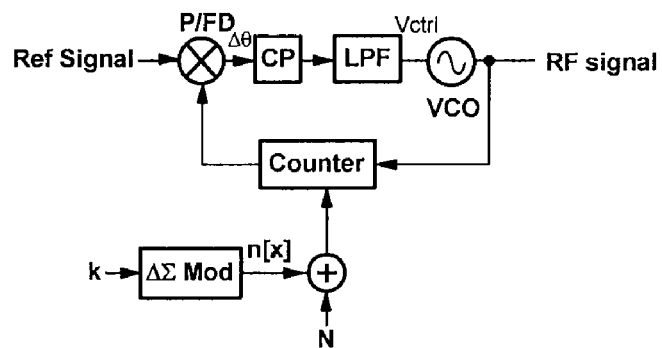
FIG. 6a shows one embodiment of a fractional-N PLL using a $\Delta\Sigma$ modulator.

A fractional-N PLL that uses a $\Delta\Theta$ modulator to develop non-integer values of N is shown in FIG. 6a. The $\Delta\Sigma$ modulator advantageously pushes spurious energy (created by the changing values of the feedback counter) to higher frequencies where it can be more effectively attenuated by the PLL's integration filter. It can be shown that the effective value of N is simply the average value described by;

$$N = \frac{\sum_{x=1}^{P} N[x]}{P}$$

where N[x] is the sequence of feedback counter values. This expands to;

$$N[x] = N_{int} + n[x]$$

where $N_{int}$ is the integer part and n[x] is the fractional part of N[x]. The ΔΣ modulator generates the sequence n[x] that satisfies the following;

$$\frac{\sum_{x=1}^{P} n[x]}{P} = \frac{k}{M}$$

where k is the input to the ΔΣ modulator with resolution M.

The ΔΣ modulator introduces quantization noise that appears at the PLL output. The pseudo-random sequence n[x] possesses a quantization error equal to ±½ around N or;

$$\Delta = \frac{1}{N}$$

It follows that the quantization noise spectral density for this error, assuming a uniform distribution, is expressed by;

$$e_{rms}^2(f) = \frac{1}{6N^2 f_{REF}}$$

over the frequency range of dc to $f_{REF}/2$. This quantization noise is advantageously shaped by an $L^{th}$ order ΔΣ modulator according to;

$$DS(z) = (1 - z^{-1})^L$$

In the PLL system, the feedback counter acts as a digital accumulator and reduces the effects of the ΔΣ modulator. That is, the output phase from the feedback counter depends on its previous output phase. As a result, the transfer function for the feedback counter (or prescaler as it is sometimes referred) is therefore;

$$P(z) = 2\pi \frac{z^{-1}}{1 - z^{-1}}$$

Combining these terms shows that the noise at the output of the feedback counter is equal to;

$$n^2(f) = e_{rms}^2(f)[DS(f)]^2[P(f)]^2$$

which yields;

$$n^2(f) = \frac{2}{3} \frac{\pi^2}{N^2 f_{REF}} \left[ 2\sin\left(\frac{\pi f}{f_{REF}}\right) \right]^{2(L-1)}$$

This noise seen at the output of the feedback counter is in turn shaped by the PLL transfer function $T_1(s)$.

Figure 6B:
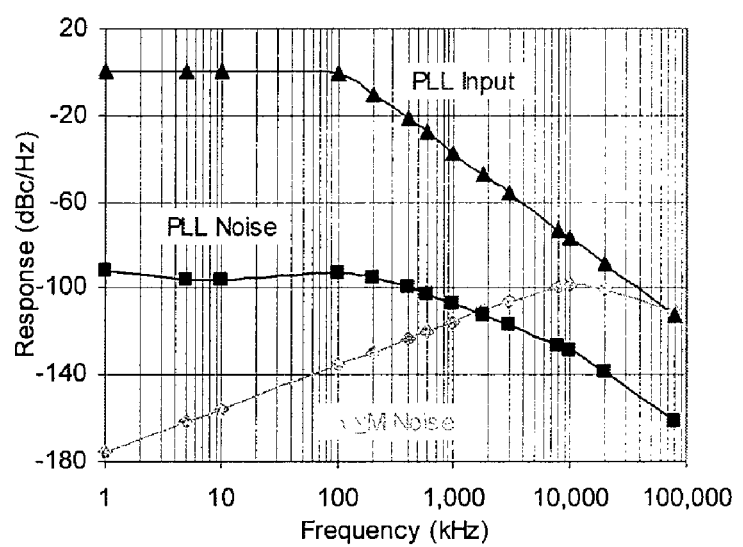

It is possible to use a fractional-N PLL as a very efficient phase/frequency modulator. That's because signals applied to the ΔΣ modulator's input control and actually modulate the frequency of the VCO according to;

$$f_{VCO} = f_c + \Delta f = (t) = (N_{int} + n[x]) f_{REF}$$

where Δf(t) is the frequency modulation and is equal to;

$$\Delta f(t) = \left(n[x] - \frac{k}{M}\right) f_{REF} = \text{FM } f_{REF}$$

and FM is the applied modulation signal. In practice, the modulation is shaped by the PLL response described by transfer function $T_1(s)$. The PLL's response generally limits the bandwidth of the system so as to attenuate the ΔΣ modulator's quantization noise. This is illustrated in FIG. 6b. Consequently, this phase/frequency modulation approach supports only narrowband signals.

Figure 7A:
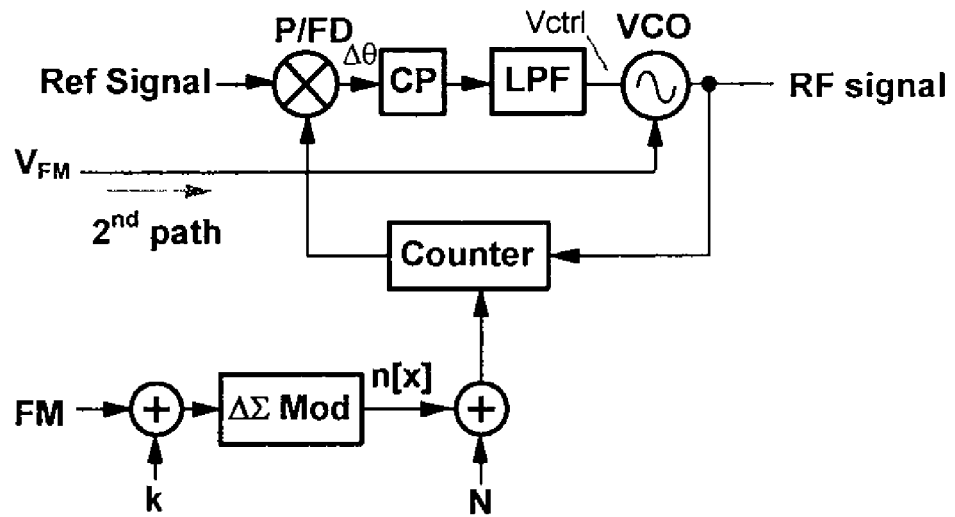
FIG. 7a illustrates one embodiment of a fractional-N PLL that supports direct frequency or phase modulation.
Figure 7B:
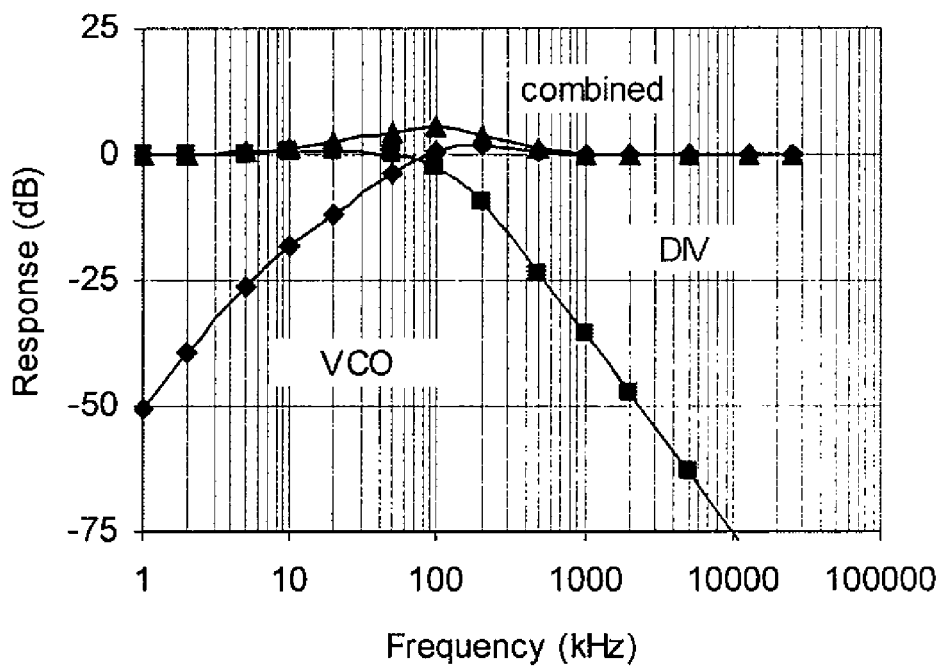

To overcome this bandwidth limitation, a second high-frequency modulation path is added to the phase-locked loop and VCO as shown in FIG. 7a. The resulting two-point frequency modulation system now displays a second and complimentary transfer function given by;

$$T_2(s) = \frac{sNK_{FM}}{sN + K_{PD}K_{VCO}Z(s)} v_{FM}$$

where $K_{FM}$ is the gain of the VCO port at which the $v_{FM}$ modulating signal is applied. Ideally, the two expressions ($T_1$ and $T_2$) combine to yield a flat and uniform response as illustrated in FIG. 7b. This occurs when;

$$\text{FM} f_{REF} = K_{FM} v_{FM}$$

Figure 7C:
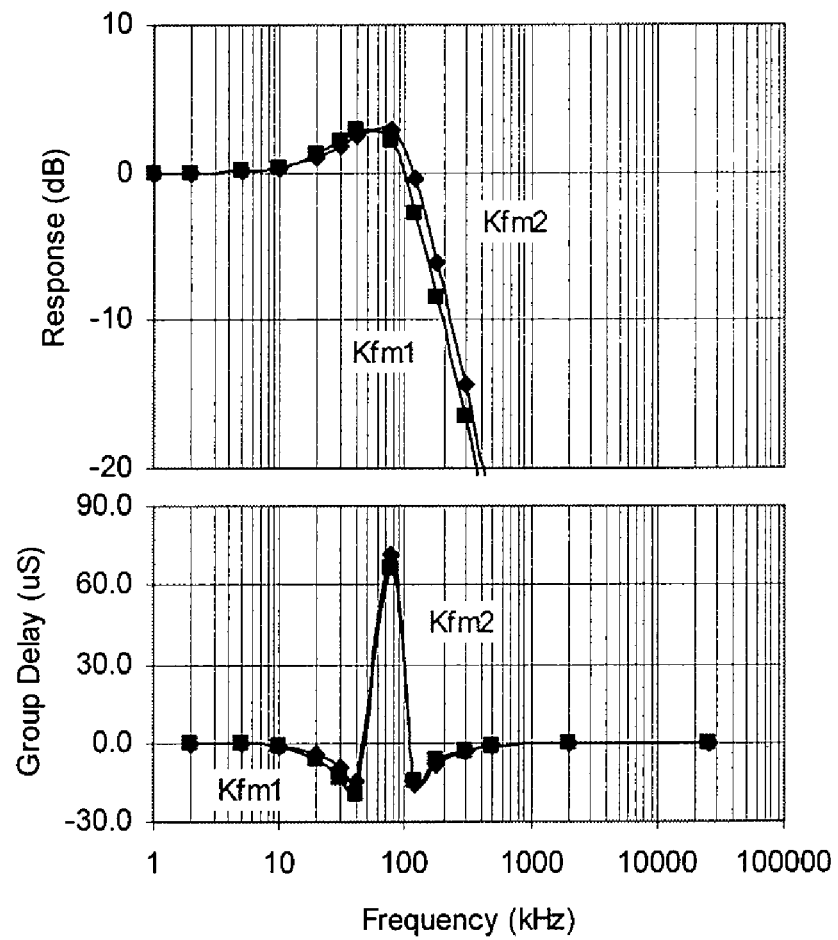
FIG. 7c illustrates the effect on the frequency response of the two point frequency modulator shown in FIG. 7a with unmatched VCO gain $K_{FM}$.
Figure 7D:
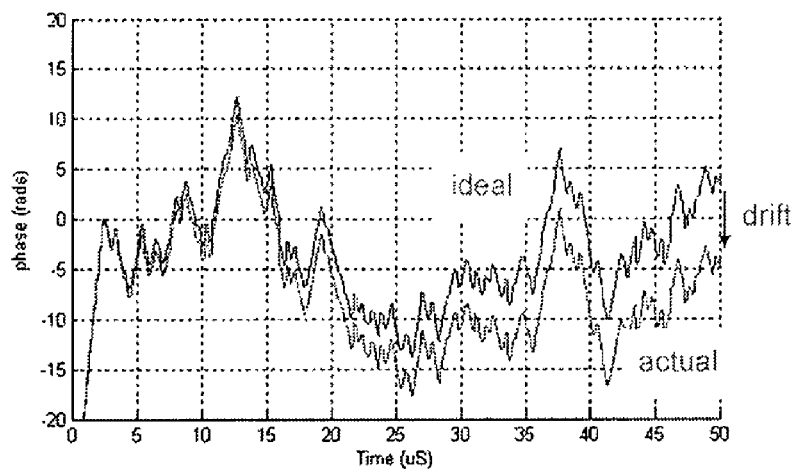
FIG. 7d illustrates the time domain impact when the two point frequency modulator shown in FIG. 7a operates with unmatched VCO gain $K_{FM}$.

The challenge with two-point modulation and specifically direct VCO modulation is that it requires near exact control of the VCO's frequency and consequently the product $K_{FM} v_{FM}$. This is illustrated in FIGS. 7c and 7d. Any frequency errors produce phase deviations that accumulate with time. Fortunately, the PLL's feedback helps to reduce these frequency errors. This occurs because the VCO output is driven by the PLL's feedback to exactly;

$$f_{VCO} = N f_{REF} + \text{FM} f_{REF}$$

which is also essentially equal to;

$$f_{VCO} = K_{VCO} v_{ctrl} K_{FM} v_{FM}$$

where $v_{ctrl}$ is the error signal produced by the phase/frequency detector and $v_{FM}$ is the FM signal applied to the VCO. Consequently, the error signal $v_{ctrl}$ compensates for any VCO gain errors within the bandwidth of the PLL's integration filter. Outside the PLL's bandwidth, the effect of the feedback decreases. This makes setting the VCO's gain $K_{FM}$ to its designed value important for wideband modulation.

Figure 8A:
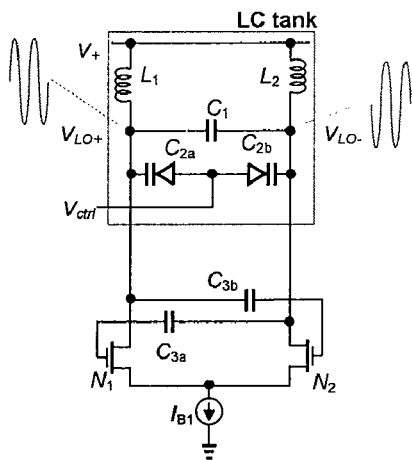
FIG. 8a shows a detailed view of a voltage-controlled oscillator.

The gain of the VCO depends heavily on the circuit structure. FIG. 8a shows a detailed view of a typical voltage-controlled oscillator. It oscillates at a frequency set by the resonance of the LC tank circuit;

$$f_{osc} = \frac{1}{2\pi\sqrt{(L_1+L_2)C_{eq}}}$$

where $C_{eq}$ is the equivalent shunt capacitance (comprised of capacitor $C_1$ and varactors $C_{2a}$-$C_{2b}$ plus any parasitic capacitance). The equivalent capacitance $C_{eq}$ may also include coarse-tuning capacitors (not shown) to subdivide the tuning range. The varactor $C_2$ (shown as $C_{2a}$ and $C_{2b}$) allows the VCO—by way of the control signal $v_{ctrl}$—to be tuned to different radio frequencies. The varactor can be realized various ways.

Figure 8B:
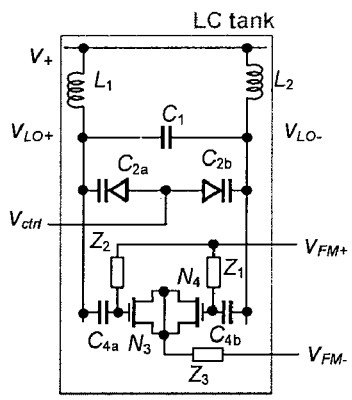
FIG. 8b shows one embodiment of a VCO tank circuit that includes an auxiliary port to support linear phase/frequency modulation.
Figure 9A:
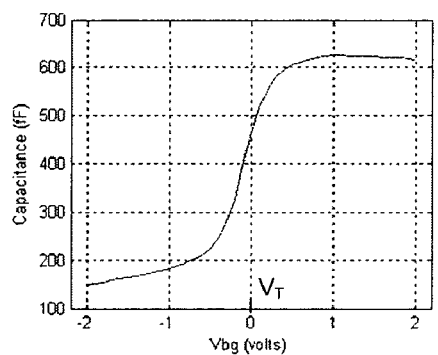
FIG. 9a shows the capacitance-voltage relationship for an accumulation-mode MOSFET device.

A VCO tank circuit that includes an auxiliary port to support linear phase/frequency modulation ($v_{FM}$ input) is shown in FIG. 8b. It uses the capacitance of accumulation-mode MOSFET devices $N_3$ and $N_4$ to achieve linear behavior even though these devices display an abrupt response as illustrated in FIG. 9a. The accumulation-mode MOSFET device presents a low capacitance $C_{min}$ at applied gate-to-bulk voltages $V_{GB}$ below the threshold voltage $V_T$ while it displays a high capacitance $C_{max}$ at applied voltages above $V_T$. (In the graph, $V_T$ equals 0.) Capacitors $C_{4a}$ and $C_{4b}$ block the dc level present at the VCO output. Resistors $Z_1$-$Z_3$ provide some isolation between MOSFETs $N_3$-$N_4$ and the $v_{FM}$ signal.

The gate-to-bulk voltage $V_{GB}$ applied to each MOSFET device $N_3$-$N_4$ depends on the oscillator's output signal $A\sin\omega t$, the modulation signal $v_{FM}$, and the common-mode voltage $v_{cm}$. The symmetric structure of the VCO means signals $V_{LO+}$ and $V_{LO-}$ are differential with;

$$V_{LO+} = A\sin\omega t \quad V_{LO-} = -A\sin\omega t$$

where A is the peak signal of each sinusoidal output and $\omega$ is the oscillation frequency. It follows then that;

$$V_{C3} = A\sin\omega t + v_{FM} - v_{cm} \quad V_{C4} = -A\sin\omega t + v_{FM} - v_{cm}$$

which describe the gate-to-bulk voltages $V_{GB}$ applied to MOSFET devices $N_3$ and $N_4$. The two MOSFET devices connect back-to-back in the VCO tank circuit, so their individual capacitances behave oppositely.

Figure 9B:
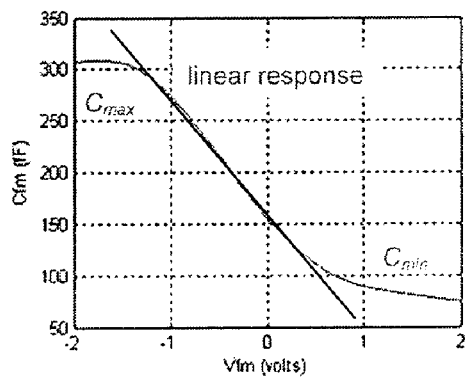
FIG. 9b shows the linear capacitance-voltage response from back to back MOSFET devices.

The modulation signal $v_{FM}$ affects the MOSFET devices as follows. The devices nominally present a capacitance equal to;

$$C_{mid} = C_{FM}(v_{FM}=0) = \frac{C_{min}C_{max}}{C_{min}+C_{max}}$$

when $v_{FM}$ equals zero. As the modulation signal $v_{FM}$ moves positive, both MOSFET devices spend more time at their maximum capacitance values $C_{max}$, so that for a period of time approximately equal to;

$$t = \frac{1}{\omega}\sin^{-1}\left(-\frac{v_{FM}}{A}\right)$$

the structure presents a capacitance equal to $C_{max}/2$. A similar response occurs as the signal $v_{FM}$ moves negative, where the structure spends an increasing period of time at $C_{min}/2$. This back-to-back structure linearizes the overall response of the accumulation-mode MOSFETs to yield the behavior shown in FIG. 9b.

In the above analysis, the common-mode voltage $v_{cm}$ is assumed to be ac ground. This introduces some error as the signal, $v_{cm}$, although small, is actually non-zero. The differential voltage $\Delta V$ (which equals $V_{LO+}-V_{LO-}$) applied to the back-to-back MOSFET devices is simply $2A\sin\omega t$ and is independent of each device's capacitance, $C_3$ and $C_4$. It has already been shown that the voltages applied to each individual MOSFET device do not track and their capacitances change oppositely. This affects the common mode voltage $v_{cm}$ according to the expression;

$$v_{cm}(t) = A\sin\omega t - \Delta V\left(\frac{C_4}{C_3+C_3}\right)$$

which simplifies to;

$$v_{cm}(t) = A\sin\omega t\left[1 - 2\left(\frac{C_4}{C_3+C_4}\right)\right]$$

Note that the bracketed term possesses the same sign as $A\sin\omega t$. This is because $C_4<C_3$ when $\sin\omega t$ is positive and $C_4>C_3$ when $\sin\omega t$ is negative. As a result, the second harmonic of $A\sin\omega t$ appears attenuated at the common-mode point. This tends to reduce positive values of the modulation signal $v_{FM}$ and expand negative values of the modulation signal, further linearizing the behavior of the back-to-back structure.

In the above analysis, it also assumes that capacitors $C_{4a}$ and $C_{4b}$ are much larger than $C_{max}$. This allows most of the VCO output signal $2A\sin\omega t$ to appear across MOSFETs $N_3$ and $N_4$. Otherwise, $\Delta V$ would change with the capacitance of the MOSFET devices.

Figure 10A:
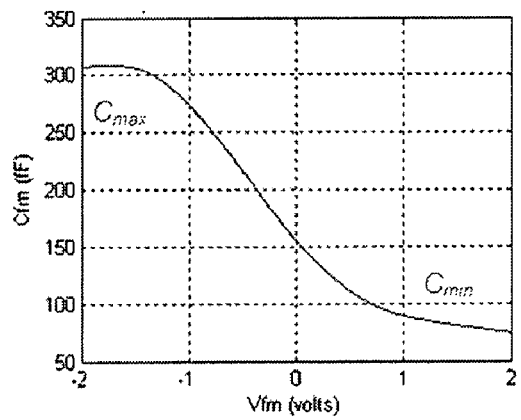
Figure 10B:
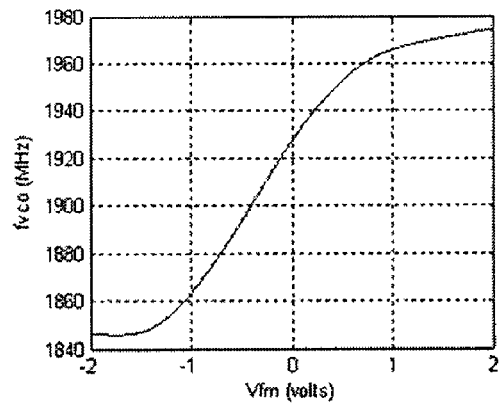
Figure 10C:
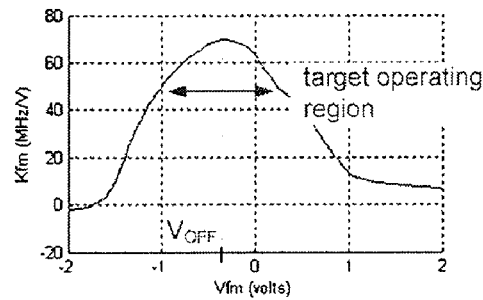

FIG. 10a shows a graph that illustrates the average capacitance of the back-to-back MOSFET devices $C_{FM}$ for different values of modulation signal $v_{FM}$. As expected, it spans from $C_{min}/2$ to $C_{max}/2$ and equals $C_{mid}$ at zero. This variable capacitance shifts the resonant frequency of the VCO's LC tank as shown in FIG. 10b. The frequency shift appears linear, but its derivative;

$$K_{FM} = \frac{d}{dv_{FM}}f_{VCO}$$

shows otherwise. The derivative (which is equivalent to the VCO gain $K_{FM}$), shown in FIG. 10c, reveals two problems. First, the peak VCO gain lies off center at an offset voltage $v_{OFF}$. This is because $C_{mid}$ lies closer to $C_{max}/2$ than $C_{min}/2$. This introduces asymmetry in the curve and potentially leads to a phase error that grows over time as illustrated in FIG. 7d. Second, the VCO gain $K_{FM}$ decreases as the modulation signal $v_{FM}$ increases. This is caused by the $\sin^{-1}$ function in the formula for the time that each MOSFET device spends at $C_{min}$ or $C_{max}$. It follows that the VCO gain can be approximated by the $2^{nd}$ order expression;

$$K_{FM}(v_{FM}) = K_{pk} - K_1(v_{FM}-v_{OFF})^2$$

where $K_{pk}$ represents the peak VCO gain at $v_{OFF}$ and $K_1$ describes the droop in the curve.

Figure 11:
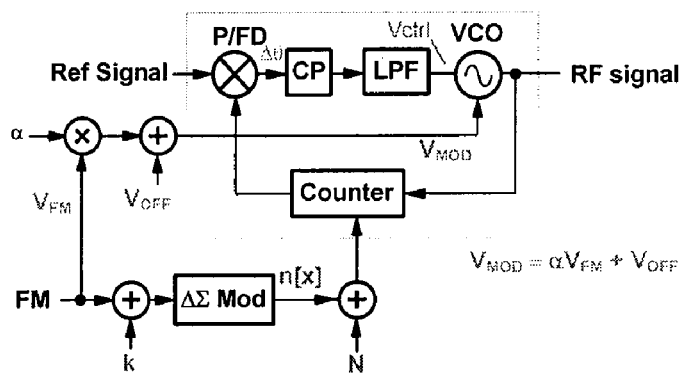
FIG. 11 illustrates the direct phase/frequency modulator with an adjustable VCO offset and gain $K_{FM}$.

The nonlinear behavior of the VCO limits the usefulness for direct phase/frequency and two-point modulation architectures. Although the PLL removes some of the distortion generated by the VCO response, the distortion becomes untenable for wideband modulation. Fortunately, the system shown in FIG. 11 improves the VCO linearity. It aligns the midpoint of the signal $v_{FM}$ to the peak VCO gain $K_{pk}$, shifting $v_{FM}$ by the appropriate offset level $v_{OFF}$ with;

$$v_{MOD} = \alpha v_{FM} + v_{OFF}$$

as shown. It also introduces a scaling parameter $\alpha$ to compensate for variations in the VCO gain $K_{FM}$.

Figure 12:
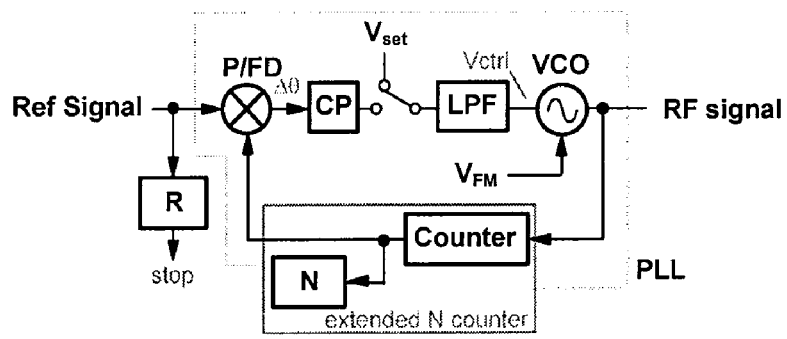
FIG. 12 shows a block diagram of the system used to initially set the parameters of the direct phase/frequency modulator.

The offset level $v_{OFF}$ can be determined by using a few different methods. One method uses the calibration system shown in FIG. 12. It disables the PLL feedback loop by setting the $v_{ctrl}$ input to a fixed level $V_{set}$. (Connecting the VCO's $v_{ctrl}$ input to a fixed level breaks the PLL feedback loop and allows the VCO to free run to a frequency that depends only on $v_{FM}$.) The system steps the FM level $v_{FM}$ and measures the frequency step $\Delta f$ until it finds the largest frequency step. (The parabolic shape of the VCO gain $K_{FM}$ curve allows a simple algorithm—such as a binary search routine.) The largest frequency step max($\Delta f$) occurs at the peak VCO gain $K_{pk}$ where $v_{FM}$ corresponds to the proper offset level $v_{OFF}$. It follows that the peak VCO gain $K_{pk}$ can be expressed as;

$$K_{pk} = \frac{\max(\Delta f)}{\Delta v_{FM}}$$

The parameter $\alpha$ then becomes approximately equal to;

$$\alpha = \frac{K_{FM(ideal)}}{K_{pk}}$$

where $K_{FM(ideal)}$ is the desired VCO gain with;

$$FMf_{REF} = K_{FM(ideal)} v_{mod} = \alpha K_{FM} v_{mod}$$

In practice, the droop in the VCO gain curve actually reduces the effective $K_{FM}$ value since;

$$K_{FM(eff)} = \Sigma K_{FM}(v_{mod}) p(v_{mod})$$

where p(·) is the probability associated with the FM signal $v_{mod}$. As such, it is better to evaluate the VCO gain at levels near the mean of the FM signal $v_{mod}$, with;

$$\alpha = \frac{K_{FM(ideal)}}{K_{FM}|_{mean(v_{mod})}}$$

The calibration system counts the number of VCO cycles N (measured by the extended N counter) in a fixed time period (set by R/$f_{REF}$) with;

$$f_{VCO} = \frac{N}{R} f_{REF}$$

where R is the number of cycles of the reference signal. A zero-phase restart signal initiates the reference (R) and extended PLL feedback (N) counters at the same time. The accuracy of the frequency measurement depends on the system's ability to read the N counter at precisely time T. Fortunately, increasing the fixed time period T reduces any read errors.

The initial calibration operates with the PLL feedback loop disabled. It nominally sets both the offset level $v_{OFF}$ and scaling parameter $\alpha$. The offset level remains fairly constant since MOSFET device capacitances $C_{min}$ and $C_{max}$ vary little with operating conditions. Unfortunately, the value of the scaling parameter $\alpha$ varies with the circuit parameters and even the oscillation frequency of the VCO—as explained below. The VCO oscillates at the resonant frequency of the LC tank given by;

$$f_{osc} = \frac{1}{2\pi \sqrt{(L_1 + L_2)(C_T + \Delta C)}} = f_c + \Delta f$$

where $C_T$ is the total tank capacitance less the variable capacitance $\Delta C$. The frequency step $\Delta f$ due to a change in the MOSFET capacitance $\Delta C$ is approximately equal to;

$$\Delta f = f_c \left[ 1 - \frac{1}{2} \frac{\Delta C}{C_T} + \frac{3}{8} \left( \frac{\Delta C}{C_T} \right)^2 \right]$$

for small values of $\Delta C$. This simplifies to;

$$\Delta f = f_c \left( -\frac{1}{2} \frac{\Delta c}{C_T} \right)$$

which can then be rewritten as;

$$\Delta f = 2\pi^2 L f_C^3 \Delta C$$

showing that $\Delta f$ changes as the third power of $f_C$. Consequently, setting the parameter $\alpha$ and the VCO gain $K_{FM}$ accurately is a challenging task.

Figure 13A:
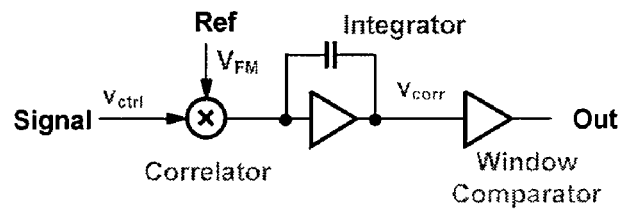
FIG. 13a shows a block diagram of the correlator network for use in a $K_{FM}$ tracking system.

It is possible to track any VCO gain errors due to improper $\alpha$ values using the correlator network shown in FIG. 13a. It computes the projection of the correction signal $v_{ctrl}$ onto the reference signal $v_{FM}$ given by;

$$v_{corr} = \int_T v_{ctrl} \times v_{FM}$$

as seen at the output of the integrator. It is desirable to remove or at least greatly reduce any dc level associated with the correction signal $v_{ctrl}$ to avoid leakage through the correlator.

Figure 13B:
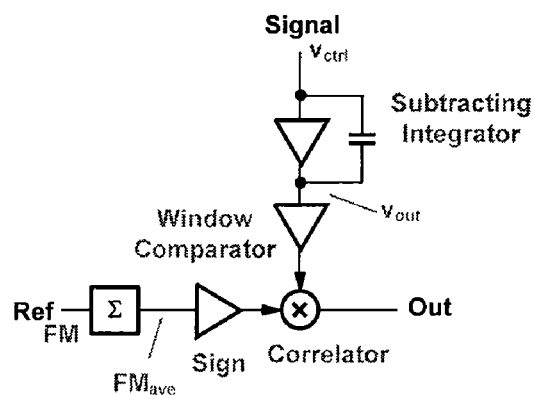
FIG. 13b shows a simplified digital variation of the correlator network for use in a $K_{FM}$ tracking system.

A digital variation of the correlator network is shown in FIG. 13b. It integrates the dynamic correction signal $v_{ctrl}$-$v_{DC}$ of the PLL, digitizes this error, and then cross-correlates it with the sign of the accumulated FM data;

$$corr = \sum_N \left[ \text{sign}\left( \int_T v_{ctrl} \times v_{DC} \right) \times \text{sign}\left( \sum_M FM \right) \right]$$

where M represents the number of accumulated FM samples and corresponds to the integration period T. Integrating both the correction signal $v_{ctrl}$ and the FM data means the cross-correlation operates on the phase of the signals instead of their frequency. This approximation proves reasonable to the exact cross-correlation expression presented above.

Figure 14A:
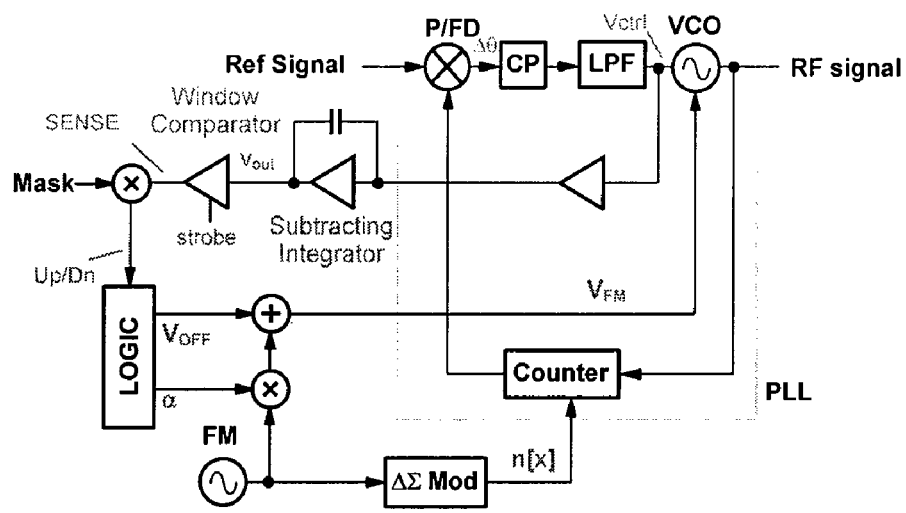
FIG. 14a shows a block diagram of a system for calibrating the scaling parameter a and the VCO gain $K_{FM}$ associated with the FM port of the VCO using the correlator network of FIG. 13b.

The system shown in FIG. 14a uses the digital correlator to track and properly adjust the VCO gain in the direct phase/frequency modulator. The PLL feedback drives the VCO to produce an output where;

$$f_{VCO} = Nf_{REF} + FMf_{REF} \text{ and } f_{VCO} = K_{VCO}v_{ctrl} + \alpha K_{FM}v_{FM}$$

Setting these two expressions equal and realizing that $Nf_{REF}$ corresponds to the radio channel yields;

$$v_{ctrl} = \frac{1}{K_{VCO}}(FMf_{REF} - \alpha K_{FM}v_{mod}) + v_{DC}$$

where $v_{DC}$ is the constant part of $v_{ctrl}$. This expression shows that the error term in parentheses moves in same direction as the FM data when the equivalent VCO gain $\alpha K_{FM}$ is set low. Similarly, the error term moves in the opposite direction of the FM data when the equivalent VCO gain $\alpha K_{FM}$ is set high. The phase tracking loop comprises logic that generates a first control signal ($V_{off}$) and a second control signal ($\alpha$). In an embodiment, the logic comprises counters, registers, or other logic suitable to increment or decrement based on the output signal received from the correlator. The logic generates the control signal ($V_{off}$) to adjust the offset of a signal applied to the VCO. The logic generates the control signal ($\alpha$) to scale the signal applied to the VCO.

Figure 14B:
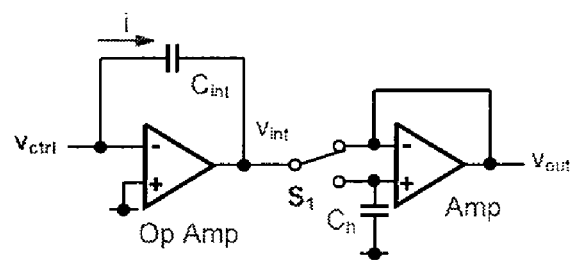

The subtracting integrator shown in FIG. 14b removes the constant part of the correction signal $v_{ctrl}$. It comprises a continuous-time integrator, a switch, and a subtracting amplifier. The continuous-time integrator provides an output signal $v_{int}$ given by;

$$v_{int}(T) = -\frac{1}{C_{int}}\int_{T_0}^{T} i(t) + v_C(T_0)$$

where $C_{int}$ is the integration capacitance, i(t) is the charging current, and $v_c$ is the residual voltage stored by the capacitor. The switch $S_1$ directs the integrator to either drive the hold capacitor $C_h$ or the inverting node of the amplifier. It toggles back and forth so that the output of the amplifier becomes;

$$v_{out}(T_2) = \frac{1}{C_{int}}\int_{T_1}^{T_2} i(t) - v_h(T_1) = \frac{1}{C_{int}}\left[\int_{T_1}^{T_2} i(t) - \int_{T_0}^{T_1} i(t)\right]$$

where $v_h(T_1)$ is the voltage stored on the hold capacitor $C_h$ and is equal to the output of the integrator at time $T_1$. Consequently, $v_{out}$ represents the change in the correction signal $v_{ctrl}$ measured over the time period of $T_1$ to $T_2$. The subtracting integrator updates the held level $v_h$ every period to capture and thereby remove any slow drift in the constant part of the correction signal $v_{DC}$.

Figure 14C:
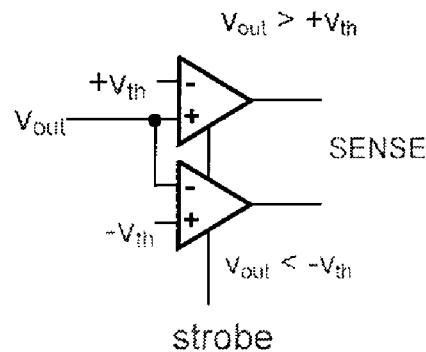

The analog window comparator shown in FIG. 14c samples the signal $v_{out}$ at the end of each period T. It normally produces a binary output that equals +1 if the $v_{out} > +v_{th}$ or −1 if $v_{out} < -v_{th}$. In addition, the window comparator also produces a third level, 0, when the output of the subtracting integrator $v_{out}$ lies within the range of $\pm v_{th}$ to prevent false triggering.

Figure 14D:
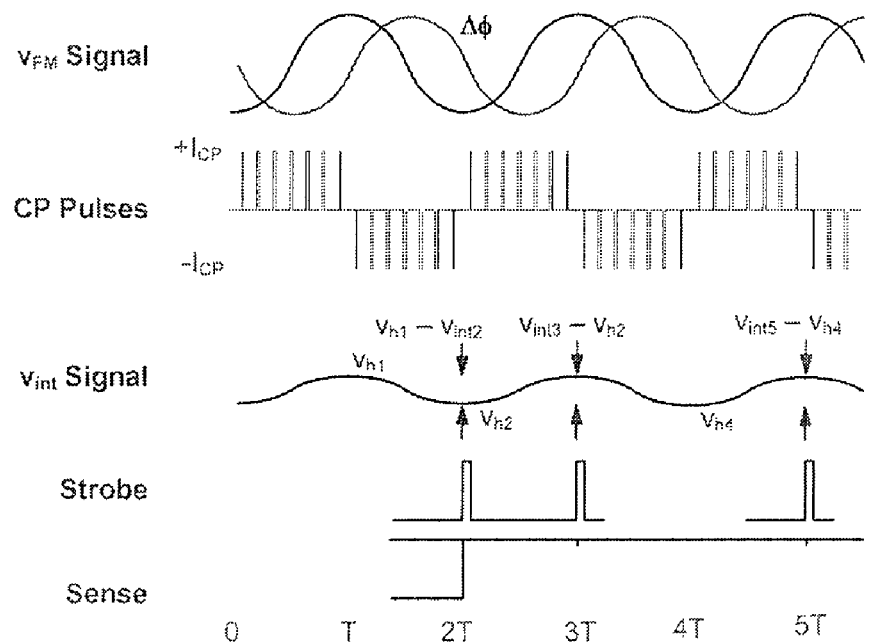

FIG. 14d illustrates the signals produced when the equivalent VCO gain $\alpha K_{FM}$ is low. Identical sinusoidal signals are applied to the VCO modulation port ($v_{mod}$) and the $\Delta\Sigma$ modulator input (FM). Ideally, the feedback counter tracks and thereby removes the direct frequency modulation. However, the low equivalent VCO gain $\alpha K_{FM}$ produces a phase error $\Delta\phi$ that's detected by the phase/frequency detector (P/FD). This in turn directs the charge pump (CP) to produce current pulses that feed the integration filter and produce the correction signal $v_{ctrl}$. As expected, the low equivalent VCO gain $\alpha K_{FM}$ produces a correction signal $v_{ctrl}$ that follows the applied $v_{FM}$ signal. The subtracting integrator and window comparator sample this signal to produce an output sequence that resembles an alternating pattern of binary values. This is cross-correlated against the FM mask—a stream of binary values corresponding to the slewing direction of the FM signal. (The mask value for positive slewing is +1, while the mask value for negative slewing is −1.) A multiplication of the two sequences produces an output that directly controls a counter and the parameter $\alpha$.

Figure 14E:
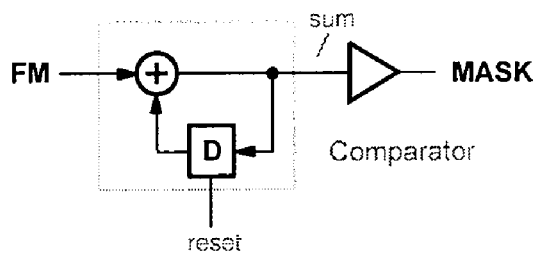

The FM mask is generated by the circuit shown in FIG. 14e. It uses a digital accumulator to integrate the FM data over each period T to produce;

$$\text{sum} = \sum_{N} FM$$

where N samples occur during the period T. At the start of the period T, the circuit resets the sum to zero; while at the end of the period T, the circuit samples the sum to produce a binary (±1) output.

Figure 14F:
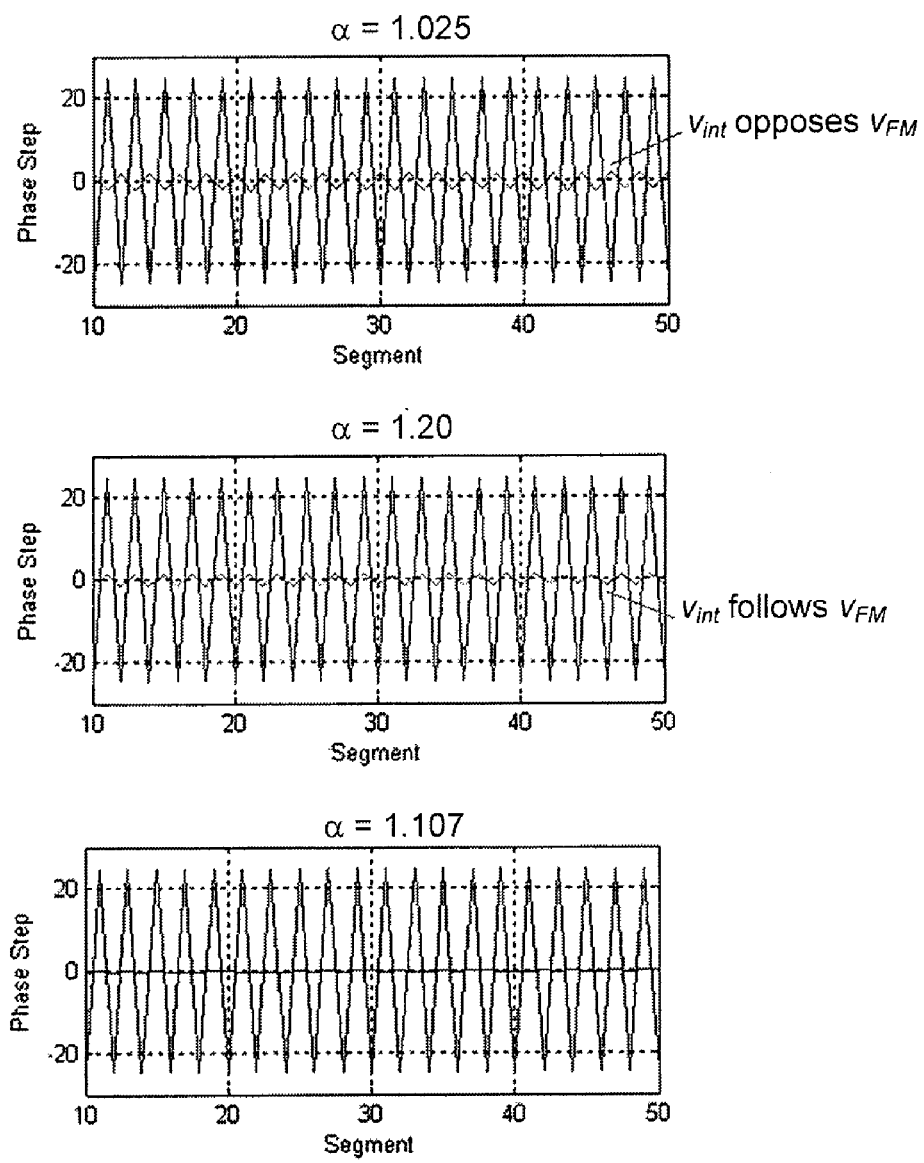
FIG. 14f illustrates the signals generated by the PLL of FIG. 14a with different a scaling parameters.
Figure 14G:
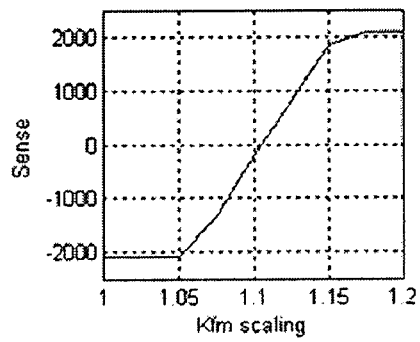

The FM signal $v_{FM}$ and correction signal $v_{ctrl}$ for a few different values of scaling parameter $\alpha$ are shown in FIG. 14f. An intentional mismatch in the peak VCO gain $K_{pk}$ and the droop in the $K_{FM}$ curve pushes the correct value for $\alpha$ slightly above 1.10. FIG. 14g shows that the system follows a linear response and therefore always converges to the correct $\alpha$ value.

The gain of the feedback loop can be increased by adding a second window comparator with a threshold level of $\pm mv_{th}$ that triggers multiple steps in the up/down counter. Another way to increase the gain of the feedback system is to trigger larger up/down counter steps when a long sequence of consecutively similar correlator outputs is recognized.

It is also possible to refine the offset level $V_{OFF}$ during the calibration of $\alpha$. This is accomplished by separately observing the positive and negative slewing FM deviations. If the output of the correlator shows some bias, then the offset level needs to shift.

Figure 15:
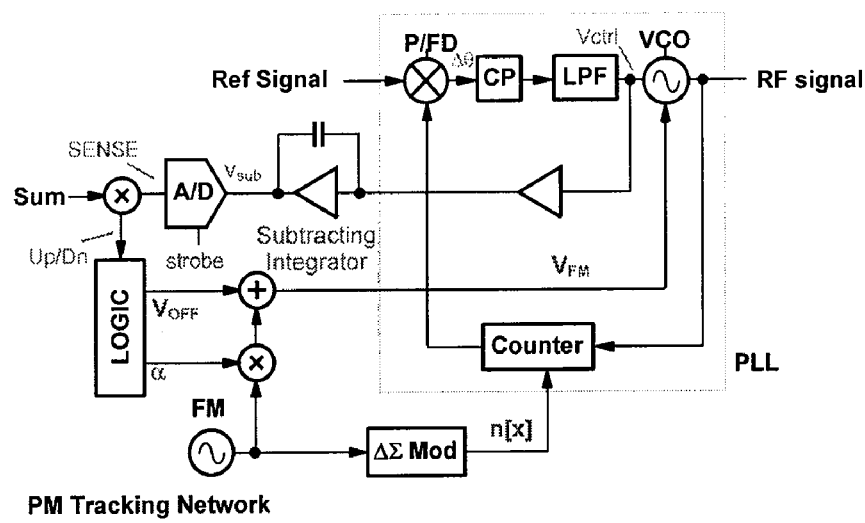
FIG. 15 shows a block diagram of the calibration system of FIG. 14a using an A/D converter instead of an analog window comparator.

A variation of the $K_{FM}$ tracking system is shown in FIG. 15. It uses an A/D converter instead of the analog window comparator to sample the dynamic correction signal. In addition, the resolution of the measurement signal is also increased by using the sum signal from the mask generator. This provides a direct measure of the VCO gain error and potentially a faster, more accurate $K_{FM}$ tracking loop. The phase tracking loop comprises logic that generates a first control signal ($V_{off}$) and a second control signal ($\alpha$). In an embodiment, the logic comprises counters, registers, or other logic suitable to increment or decrement based on the output signal received from the correlator. The logic generates the control signal ($V_{off}$) to adjust the offset of a signal applied to the VCO. The logic generates the control signal (α) to scale the signal applied to the VCO.

As mentioned earlier, the scaling parameter α depends on the VCO's circuit elements and its operating frequency ($f_c$). But it also depends on the FM data applied to the two-point phase/frequency modulator. That's because the FM data maps to the VCO, which displays a curved $K_{FM}$ response that droops at larger FM signals $v_{FM}$. As a result, the effective $K_{FM}$ depends on the distribution of the FM data and the $K_{FM}$ curvature. This is approximately equal to;

$$\langle K_{FM} \rangle = \frac{1}{N} \sum_N K_{FM}(v_{MOD})$$

where $\langle K_{FM} \rangle$ represents the ensemble average of the function $K_{FM}$, which varies with the adjusted FM signal $v_{MOD}$ applied to the VCO. Fortunately, the $K_{FM}$ tracking system shown in FIG. 14a properly adjusts the scaling parameter α in real time—that is, as the FM data drives the VCO.

Figure 16:
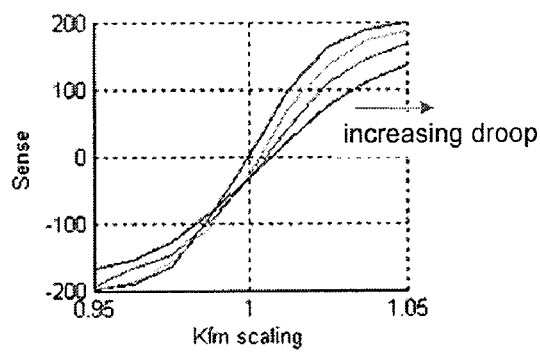
FIG. 16 shows the effect of $K_{FM}$ curvature on the scaling parameter α as determined by the calibration systems shown in FIG. 14a and FIG. 15.

The $K_{FM}$ tracking system also compensates for changes in the VCO curve, in particular, the $K_{FM}$ droop. This is important because the droop and the peak VCO gain $K_{pk}$ both increase as the VCO amplitude decreases. In addition, circuit changes may also affect the droop in the $K_{FM}$ curve. Fortunately, the tracking system resolves changes in the droop as well as other parameters and adjusts the parameter α accordingly as illustrated by FIG. 16.

Figure 17A:
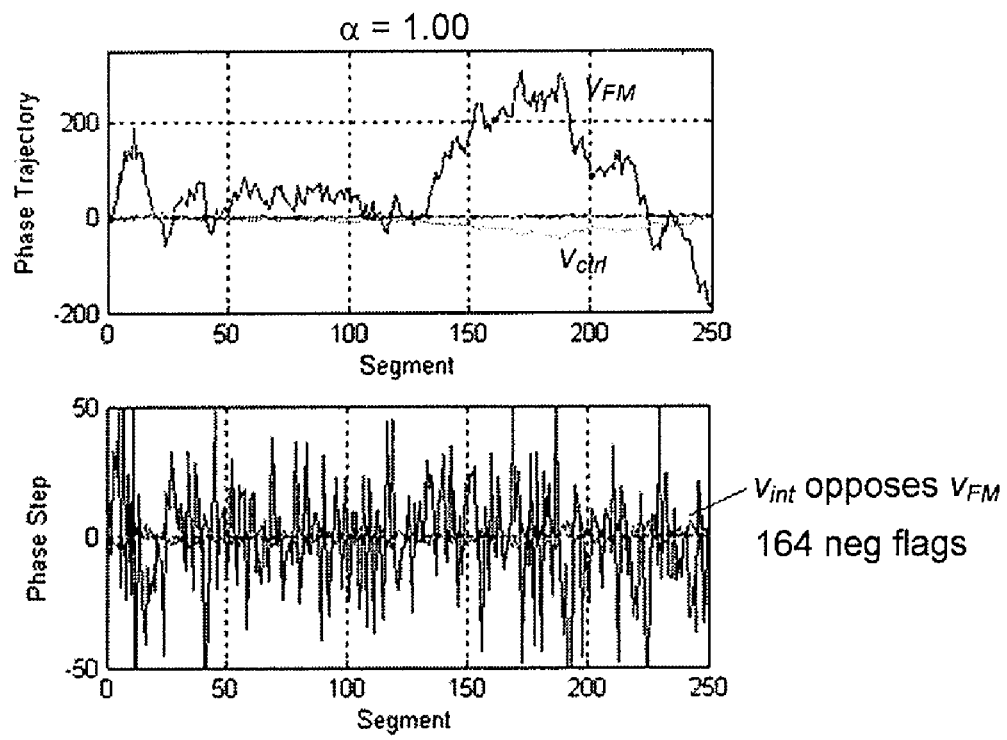
FIG. 17a shows the operation of the tracking system for WCDMA RCC1 data with a set low.
Figure 17B:
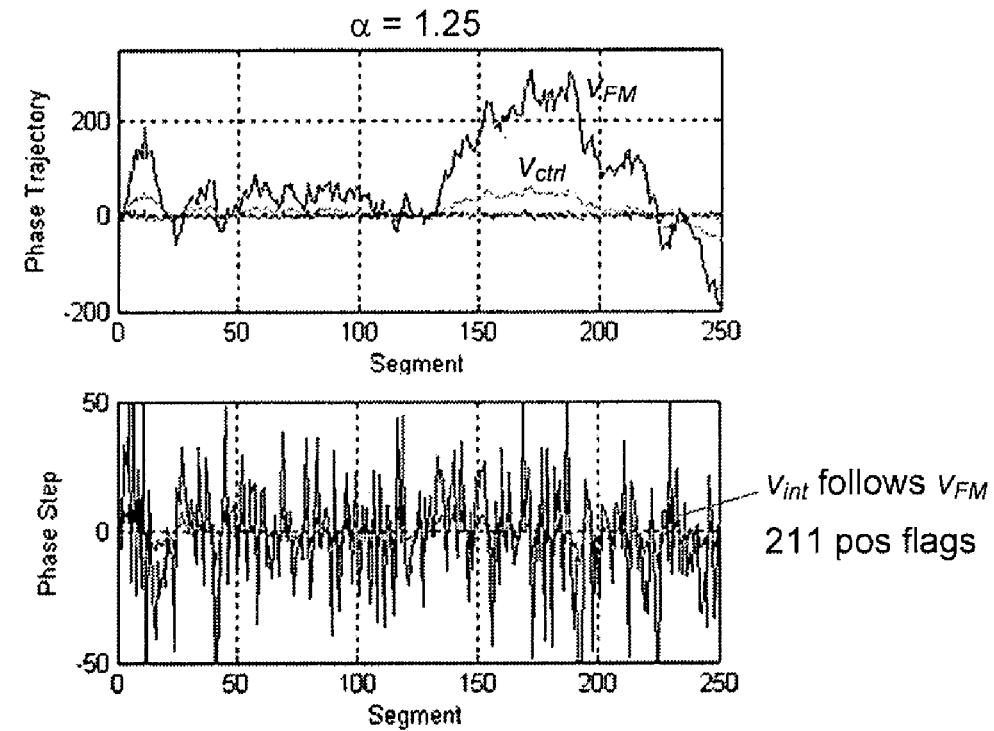
FIG. 17b shows the operation of the tracking system for WCDMA RCC1 data with a set high.
Figure 17C:
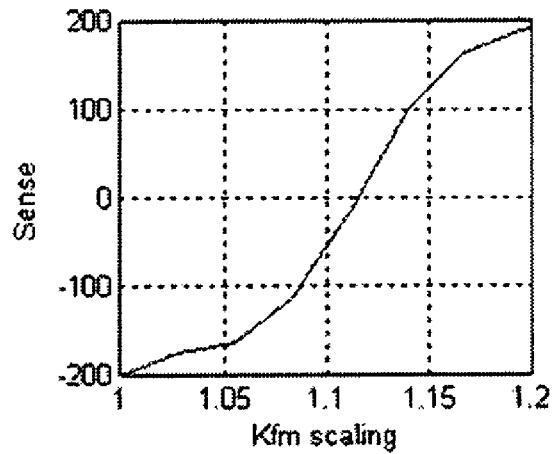
FIG. 17c illustrates the convergence of the tracking system of FIG. 16 with WCDMA RCC1 data.

FIG. 17 shows the operation of the tracking system with WCDMA RCC1 FM data applied. The effects of low and high α values are shown in FIGS. 17a and 17b respectively. As with the sinusoidal FM signal, the system displays a linear response in FIG. 17c which ensures convergence to the optimum α value.

Figure 18A:
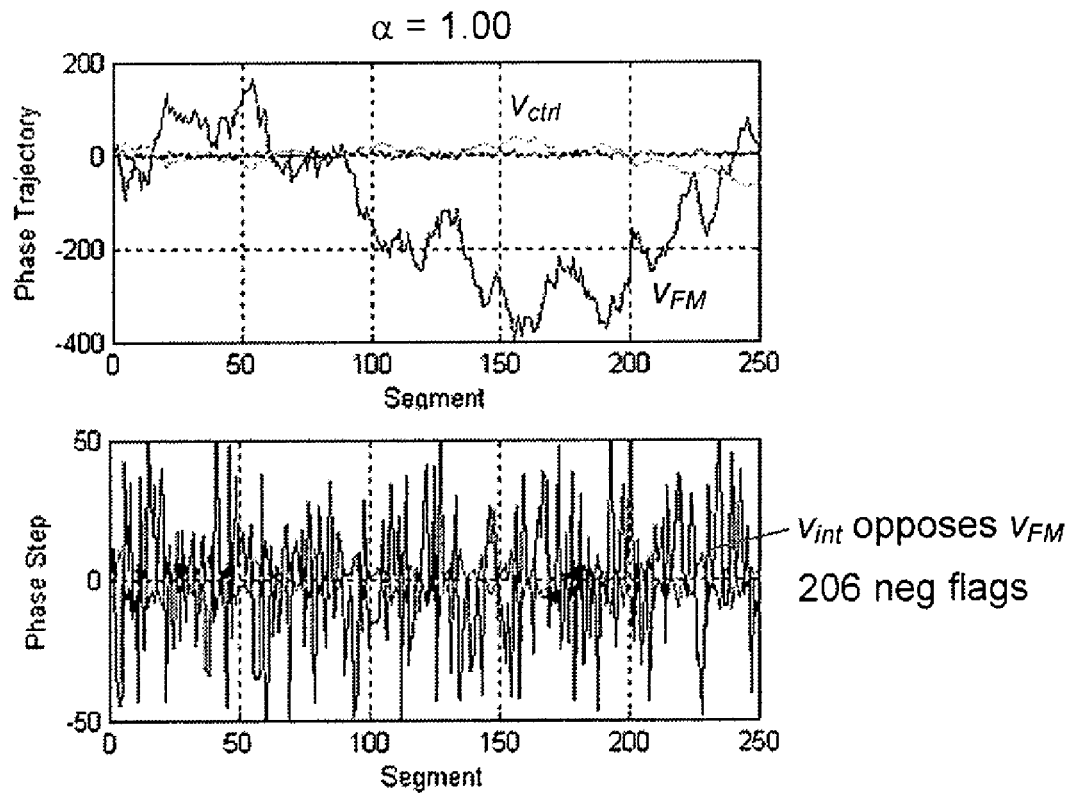
FIG. 18a shows the operation of the tracking system for WCDMA RCC3 high-speed data with a set low.
Figure 18B:
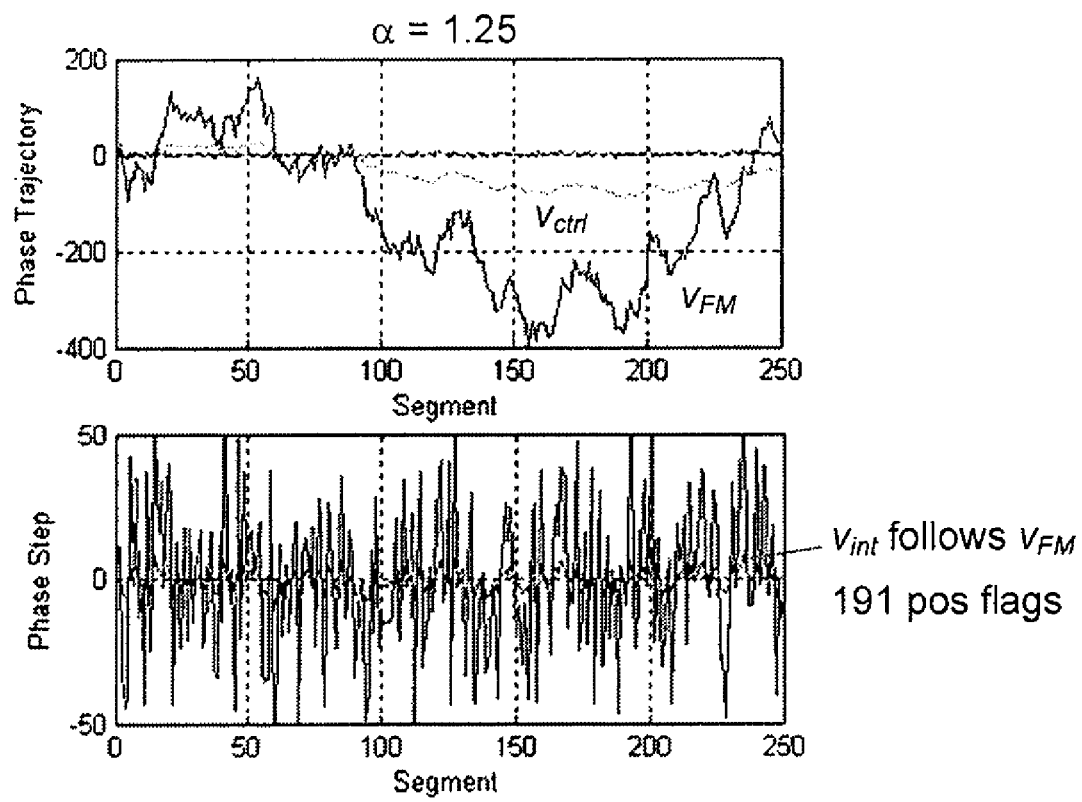
FIG. 18b shows the operation of the tracking system for WCDMA RCC3 high-speed data with a set high.
Figure 18C:
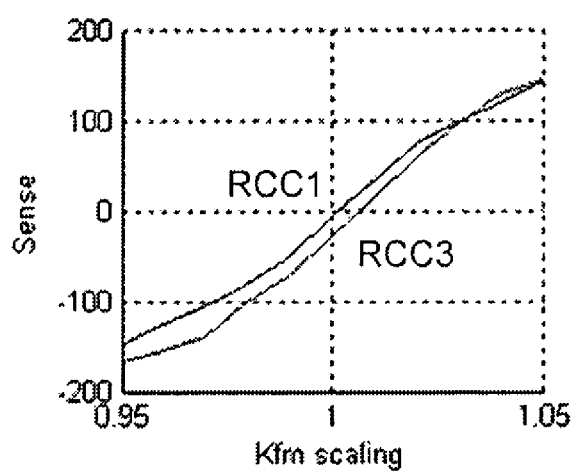
FIG. 18c illustrates the convergence of the tracking system of FIG. 16 with WCDMA RCC3 high-speed data.

FIGS. 18a-c illustrate the operation of the tracking system with WCDMA RCC3 high-speed FM data applied. As with the previous example, the behavior is predicted and the convergence is guaranteed. Notice in FIG. 18c that the higher-amplitude RCC3 FM data shifts the scaling factor as compared to the RCC1 FM data.

This innovative closed-loop system advantageously tracks real-time errors in the two-point frequency modulator. It provides methods and apparatus to compensate for various changes in the VCO amplitude, temperature shifts, and the distribution of the FM signal as it affects the VCO gain $K_{FM}$. As such, it addresses an important issue associated with two-point phase/frequency modulation systems. It should be noted that embodiments of the system are suitable for implementation using analog and digital technology including implementations in discrete hardware, gate arrays, programmable logic or other hardware implementations. The system is also suitable for implementations in software, for example, a computer program comprising program instructions that are executed by one or more processors.

The foregoing description, for purposes of explanation, used specific nomenclature to provide a thorough understanding of the invention. However, it will be apparent to one skilled in the art that the specific details are not required in order to practice the invention. In other instances, well-known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the following Claims and their equivalents define the scope of the invention.

What is claimed is:

1. Apparatus for providing a two point phase/frequency modulation system, the apparatus comprising:
    a first network configured to introduce an offset to center a signal applied to a VCO;
    a second network configured to set a gain of the VCO; and
    a phase tracking network configured to dynamically adjust the offset and the gain.

2. The apparatus of claim 1 wherein the phase tracking network includes a correlator network operative to track an error signal applied to the VCO.

3. Apparatus for providing a two point phase/frequency modulation system, the apparatus comprising:
    a first network configured to introduce an offset to center a signal applied to a VCO;
    a second network configured to set a gain of the VCO; and
    a phase tracking network configured to dynamically adjust the offset and the gain;
    wherein the phase tracking network includes a correlator network operative to track an error signal applied to the VCO and
    wherein the correlator network includes:
        a subtracting integrator;
        a window comparator coupled to an output of the subtracting integrator; and
        a correlator coupled to an output of the window comparator.

4. Apparatus for tracking in a two point phase/frequency modulation system to adjust an offset and scale of a signal applied to a VCO, the apparatus comprising:
    a subtracting integrator configured to capture a dynamic correction signal;
    a window comparator configured to determine a polarity of an output signal of the integrator;
    a correlator network configured to project the dynamic correction signal onto a reference modulation signal; and
    logic configured to generate, based on the output signal of the correlator, a control signal (Voff) to adjust the offset of a signal applied to the VCO and a control signal (Valpha) to scale the signal applied to the VCO.

5. The apparatus of claim 4 wherein the correlator network is an analog network comprising:
    a correlator element coupled at a first input to a control signal and at a second input to a reference signal;
    an integrator coupled at an input to an output of the correlator element, the integrator comprising:
        an op-amp element; and
        a capacitor element; and
    a window comparator coupled to an output of the integrator.

6. The apparatus of claim 4 wherein the correlator network is a digital network comprising:
    a subtracting integrator having an input coupled to a control signal;
    a window comparator having an input coupled to an output of the subtracting integrator;

a network configured to generate a sign signal based on accumulated FM data; and a correlator element configured to cross-correlate the sign signal and an output from the window comparator.

7. Apparatus for tracking the operation of a two point phase/frequency modulation system to adjust the offset and/or the scaling applied to the signal driving the VCO, the apparatus comprising:

a subtracting integrator configured to capture a dynamic correction signal;

an A/D converter for measuring an output of the integrator;

a correlator configured to project the dynamic correction signal onto a reference modulation signal and produce a correlation signal;

logic configured to generate, based on the output signal of the correlator, a control signal (Voff) to adjust the offset of a signal applied to the VCO and a control signal (Valpha) to scale the signal applied to the VCO.

8. A phase/frequency modulation system, comprising:

a phase-locked loop (PLL) having a VCO including a first port and a second port wherein during operation of the PLL an error signal is received by the first port;

a correlator network configured to produce an output signal based upon the error signal and a function of an applied FM modulation signal; and a phase tracking loop which generates, in response to the output signal, a VCO control signal applied to the second port.

9. The system of claim 8 wherein the function comprises a sign function.

10. The system of claim 8 wherein the phase tracking loop includes:

logic configured to generate an offset adjustment signal and a gain adjustment signal, and a tracking network for providing the VCO control signal based upon the offset adjustment signal and the gain adjustment signal.

11. A method for providing two point phase/frequency modulation, comprising:

generating an offset signal;

providing the offset signal to center a modulation signal applied to a VCO element of a phase-locked loop;

generating a gain signal;

providing the gain signal to set a gain of the VCO; and dynamically tracking, during operation of the phase-locked loop, the offset and the gain of the VCO so as to generate one or more additional correction signals to be applied to the VCO.

12. The method of claim 11 wherein said dynamically tracking is performed in part using a correlator network operative to track an error signal applied to the VCO.

13. A method for tracking the relationship between a direct modulation FM signal applied to a phase-locked loop (PLL) and a PLL feedback signal, comprising:

generating, using cross-correlation between the FM signal and feedback signal, a correlation signal that:

follows the FM signal when the FM signal is scaled below a first predefined scaling threshold; and moves opposite to the FM signal when the FM signal is scaled above a second predefined threshold; and providing said correlation signal to the PLL so as to adjust the output of a VCO element of the PLL.

14. The method of claim 13 wherein said generating comprises;

accumulating a data signal component of the FM signal for a predefined time interval to generate an accumulated data signal;

generating a sign signal based on said accumulating;

integrating the control signal for the predefined time interval to generate an integrated control signal; and comparing the accumulated data signal and integrated control signal to generate the correlation signal.

* * * * *